(12) United States Patent
Kato

(10) Patent No.: US 7,525,247 B2
(45) Date of Patent: Apr. 28, 2009

(54) SUBSTRATE FOR ORGANIC EL DISPLAY DEVICES AND ORGANIC EL DISPLAY DEVICES

(75) Inventor: Naoki Kato, Yokohama (JP)

(73) Assignee: OPTREX Corporation, Tokyo (JP)

( * ) Notice: Subject to any disclaimer, the term of this patent is extended or adjusted under 35 U.S.C. 154(b) by 691 days.

(21) Appl. No.: 11/138,275

(22) Filed: May 27, 2005

(65) Prior Publication Data

US 2005/0264180 A1 Dec. 1, 2005

(30) Foreign Application Priority Data

May 28, 2004 (JP) ............................. 2004-160227

(51) Int. Cl.
*H01J 1/62* (2006.01)
*G09G 3/10* (2006.01)
(52) U.S. Cl. .................... 313/505; 313/498; 315/169.1; 315/169.3; 345/44; 345/48
(58) Field of Classification Search ......... 313/498–506; 345/44–48; 315/169.1, 169.2, 169.3
See application file for complete search history.

(56) References Cited

FOREIGN PATENT DOCUMENTS

| JP | 06-020774 | 1/1994 |
|----|-----------|--------|
| JP | 2003-282253 | 10/2003 |

*Primary Examiner*—Nimeshkumar D. Patel
*Assistant Examiner*—Anne M Hines
(74) *Attorney, Agent, or Firm*—Oblon, Spivak, McClelland, Maier & Neustadt, P.C.

(57) ABSTRACT

A first organic EL display device has cathode-common wires for aging, first and second connection resistances at cathode side for aging, and a cathode-lead wire for aging formed thereon, the cathode-lead wire for aging connecting between a first connection resistance at cathode side for aging on a side remote from the cathode-common wires for aging and the cathode-common wires for aging. The cathode-lead wire for aging is drawn out of the first connection resistance at cathode side for aging, passes outside cathode circuitous wiring in a second organic EL display device adjacent the first organic EL display device, passes through a space defined by the second organic EL display device, first and second connection resistances at cathode side for aging of the second organic EL display device, and a connection resistance at anode side for aging of the second organic EL display device, and is connected to the cathode-common wires for aging.

8 Claims, 7 Drawing Sheets

FROM ANODES OF
LOWER PORTION
OF SUBSTRATE

TO ANODE-LEAD
WIRE FOR AGING
23

CATHODE-LEAD
WIRE FOR AGING
24

FROM ANODES OF
LOWER PORTION
OF SUBSTRATE

SUBSTRATE FOR ORGANIC EL DISPLAY DEVICES AND ORGANIC EL DISPLAY DEVICES

BACKGROUND OF THE INVENTION

1. Field of the Invention

The present invention relates to a substrate for organic EL display devices and organic EL display devices, which are capable of being effectively subjected to an aging treatment.

2. Description of the Related Art

Organic EL (electroluminescence) display devices are current-drive display devices, which emit light by themselves when a current is supplied to the organic EL layers interposed between an anode and a cathode provided so as to be opposite each other. The organic EL display devices are also called organic LEDs because of having characteristics similar to semiconductor light emitting diodes.

Organic EL devices have such a structure that a plurality of anode strips, which is connected to an anode or forms an anode per se, is provided on a glass substrate in parallel with one another, that a plurality of cathode strips, which is connected to a cathode or forms a cathode per se, is provided in parallel with one another and in a direction orthogonal to the anode strips, and that organic EL layers are interposed between both sets of electrode strips. In organic EL devices wherein the anode strips and the cathode strips are provided in a matrix pattern, each of pixels is formed by the intersection of an anode strip and a cathode strip. In other words, the pixels are provided in a matrix pattern. In general, the cathode strips are made of metal, and the anode strips are made of a transparent conductive layer of, e.g., ITO (indium/tin/oxide).

When the organic EL devices wherein the anode strips and the cathode strips are provided in a matrix pattern are driven by passive matrix addressing, the electrodes in one of the set of anode strips or the set of cathodes strips serve as scanning electrodes, and the electrodes in the other set serve as data electrodes. The scanning electrodes are connected to a scanning electrode driving circuit including a constant-voltage circuit in order to drive scanning electrodes at a constant voltage. The data electrodes are connected to a data electrode driving circuit having a constant-current circuit provided at an output stage. In synchronization with scanning, the respective data electrodes are supplied with a current, which is produced in response to a display data for the row corresponding to a selected scanning electrode.

When organic EL display devices having an organic EL device are driven at a constant current, luminance is gradually decreasing with the lapse of time. The higher the initial luminance is, the more greatly the degree of luminance decreases. For example, when the initial luminance is twice, the half luminance lifetime is reduced to about half. Additionally, there is caused a phenomenon that luminance varies from pixel to pixel. This is because the longer light emitting time a pixel has, the darker the pixel becomes. This phenomenon is called "image sticking". When adjacent pixels have a luminance difference of from about 3 to about 5%, the luminance difference can be visually recognized.

When organic EL display devices are energized, the luminance of the organic EL display devices greatly decreases at the initial stage and then is gradually decreasing in most cases. In a case wherein the luminance is decreasing in that way, when organic EL display devices, which have been driven for some period of time and have reduced luminance, are newly set at an initial state, the luminance is moderately decreasing after the initial state. The treatment wherein organic EL display devices are driven for some period of time to reduce the luminance before the organic EL display devices are practically used (before practical use) is called an aging treatment (hereinbelow, referred to as a lifetime aging treatment).

As the lifetime aging treatment, there is a method wherein the anode strips of an organic EL display device are short-circuited through a lead wire and connected to a voltage applying device, and wherein the cathode strips of the organic EL display device are also short-circuited through a lead wire and connected to the voltage applying device (see JP-A-6-20774, paragraphs 0003 and 0006, and FIG. 8). A voltage pulse is applied between the lead wire for connection of the anode strips and the lead wire for connection of the cathode strips from the voltage applying device for a certain period of time.

During fabrication of organic EL display devices, a foreign substance, such as dirt, is mixed into organic EL layers disposed between an anode strip and a cathode strip, or a projection that is formed on an anode strip intrudes into organic EL layers in some cases. When electric charges gather at such a foreign substance or projection to locally produce heat during practical use of such an organic EL display devices, decomposition of an organic substance in the organic EL layer progresses. Finally, the organic substance is broken along with a cathode strip, and short-circuit between the cathode strip and an anode strip (interlayer short-circuit) occurs. When the short-circuit occurs, there is caused a phenomenon that a specific pixel fails to emit light during practical use.

In order to avoid the occurrence of such a phenomenon during practical use, an aging treatment is performed wherein a defective portion with a foreign substance mixed therein is preliminarily put in an insulated state as an electrically open state or in a non-conducting state by oxidation as disclosed in, e.g., JP-A-2003-282253, paragraphs 0004 to 0007 (hereinbelow, referred as to the short-circuit aging treatment). The short-circuit aging treatment is performed by applying a d.c. voltage pulse between the anode strips and the cathode strips for a certain period of time.

BRIEF SUMMARY OF THE INVENTION

When an organic EL display device using an organic EL device is fabricated, it is common to form a plurality of organic EL devices on a single large glass substrate. As shown in FIG. 6 as a process flowchart, a usual fabrication process performs an organic EL device forming step for forming electrode strips and organic EL layers on a single glass substrate, a sealing step for using an opposite substrate made of, e.g., glass to isolate the organic EL layers from ambient air for protection against, e.g., moisture in each of the organic EL devices, a cutting step for cutting the glass substrate to separate the organic EL devices from one another, an optical film applying step for applying an optical film, such as a circular polarizer, to each of the organic EL devices for prevention of reflection, and a mounting step for mounting peripheral circuits, such as driving circuits, to complete organic EL display devices in this order.

In order to effectively perform the short-circuit aging treatment or the lifetime aging treatment, it is preferred to perform these aging treatments before the cutting step. In order to perform these aging treatments before the cutting step, there has been a proposal wherein wires, which are used for application of a voltage for the aging treatments, and which are connectable to a voltage applying device provided outside organic EL display devices, are disposed on a glass substrate with a large number of organic EL devices formed thereon, and wherein the voltage is collectively applied between the anode strips and between the cathode strips of the organic EL devices (JP-A-2004-146212). The connected state of the anode strips and the connected state of the cathode strips by such wires are eliminated by cutting the wires in the cutting step. By this proposal, it is possible to effectively subject such a large number of organic EL devices to the aging treatments for a short period of time.

However, the proposal stated earlier is difficult to be applied to the aging treatments in some cases. Some organic EL display devices are configured to have wires formed on a glass substrate so as to be drawn out of three sides of the rectangular plane of each organic EL device forming an active area. In other words, some organic EL display devices are configured to have wires for connection of the anode strips with a driving circuit or anode-mounting terminals (hereinbelow, referred to as the anode circuitous wiring) drawn out of one side of the rectangular plane, and to have wires for connection of the cathode strips with a driving circuit or cathode-mounting terminals (hereinbelow, referred to as the cathode circuitous wiring) drawn out of both right and left sides of the rectangular plane. When the driving circuits are mounted by COF (Chip On Film) or TAB (Tape Automated Bonding), the anode-mounting terminals and the cathode-mounting terminals are formed on a glass sheet, the anode strips are connected to the anode-mounting terminals through the anode circuitous wiring, and the cathode strips are connected to the cathode-mounting terminals through the cathode circuitous wiring. Or, the cathode strips of odd-numbered rows are connected to the cathode circuitous wiring on the left side of each organic EL device, and the cathode strips of even-numbered rows are connected to the cathode circuitous wiring on the right side of each organic EL device, for example.

FIG. 8 is a schematic plan view showing an organic EL display device 200, which is connected to driving circuits (not shown) by COP or TAB. Although a large number of organic EL display devices are formed on a single glass substrate so as to be connected to one another, only one of the organic EL display devices is shown as the organic EL display device 200 in FIG. 8. In the following explanation, anode strips will be simply called anodes, and cathode strips will be simply called cathodes.

As shown in FIG. 8, the organic EL display device 200 has a lower portion formed with anode-mounting terminals 5 and two sets of cathode-mounting terminals 6. When anode circuitous wiring 10 extends from upper portions of the anode-mounting terminals 5 to the organic EL device 7, and when cathode circuitous wiring 11 extends from upper portions of the two sets of cathode-mounting terminals 6 to the organic EL device 7, it is difficult to apply the proposal stated earlier. This is because it is difficult to secure a route (wiring) for electrical connection of the anodes outside the organic EL display device 200 on the glass sheet and simultaneously to secure a route (wiring) for electrical connection of all cathode circuitous wiring 11 outside the organic EL display device 200 on the glass sheet, the cathode circuitous wiring existing in left and right areas.

As indicated by dotted lines under the organic EL display device 200 in FIG. 8, it is proposed that a special area 201 is formed on the glass sheet in order to secure the route for electrical connection of the anodes outside the organic EL display device and the route for electrical connection of all cathode circuitous wiring 11 outside the organic EL display device 200, the cathode circuitous wiring existing in the left and right areas. For, e.g., the purpose of avoiding the problem that when an anode and a cathode of an organic EL device is short-circuited during an aging treatment, the voltage applied to the other organic EL devices is lowered, it is preferred to provide a resistive area having a relatively high resistance.

In order to provide such a resistive area, a connection resistance at anode side for aging 21 and connection resistances at cathode side for aging 22 are formed in the area 201 shown in FIG. 8. In the area with the connection resistance at anode side for aging 21 formed therein, there are formed resistors, which correspond to the respective anodes of another organic EL display device (not shown) located below the area 201 shown in FIG. 8 before cutting. In the areas with a connection resistance at cathode side for aging 22 formed therein, there are formed resistors, which correspond to the respective cathodes of the organic EL display device (not shown) located below the area 201 shown in FIG. 8 before cutting.

When the organic EL display device 200 is fabricated as shown in FIG. 8, the respective anodes can be connected to anode-common wires for aging 3 through anode connection wires 41 and a connection resistance at anode side for aging formed in an area 201 (a connection resistance at anode side for aging 21 formed in another area 201, not shown, located above the organic EL display device 200 shown in FIG. 8). The anode-common wires for aging 3 is connected to a power supply for an aging treatment during an aging treatment. Additionally, the cathode circuitous wiring 11 can be connected to the cathode-common wires for aging 4 through the cathode-mounting terminals 6 and the connection resistances at cathode side for aging 22. The cathode-common wires for aging 4 is connected to the power supply for the aging treatment. After complication of the aging treatment, the glass substrate is cut and divided into respective organic EL display devices, each of the areas 201 is discarded.

By fabricating each of organic EL display devices as shown in FIG. 8, it is possible to collectively subject a large number of organic EL display devices to the aging treatment even when each of the organic EL display devices is configured to have wires drawn out of three sides of the organic EL device having a rectangular shape. However, the number of the organic EL display devices cut out of a single glass substrate is decreased since it is necessary to provide the areas 201 that are not utilized as the organic EL display devices. As a result, the production cost of the organic EL display devices is increased.

It is an object of the present invention to provide a substrate for organic EL display devices and organic EL display devices, which are capable of being collectively subjected to an aging treatment without decreasing the number of the organic EL display devices cut out of a single glass substrate, each of the organic EL display devices being configured to have wires drawn out of three sides of the organic EL device having a rectangular shape.

According to a first aspect of the present invention, there is provided a substrate for organic EL display devices, which comprises a plurality of structures, each of the structures having anode strips, organic EL layers and cathode strips and being formed in a rectangular shape, wherein wires for connection with the cathode strips are connected to a first side and a second side of an organic EL device, and wires for connection with the anode strips are connected to a third side of the organic EL device, and wherein anode-mounting terminals and cathode-mounting terminals, which are connected to a driving circuit, are formed in a portion in the vicinity of the third side of each of the structures; each of the structures comprising anode-common wires for aging formed so as to pass in the vicinity of the first side; each of the structures comprising cathode-common wires for aging formed so as to pass in the vicinity of the second side; each of the structures comprising a connecting member for the anode strips formed in the vicinity of a fourth side, the connecting member for the anode strips being electrically connected to anode strips of another organic EL device adjacent the fourth side; each of the structures comprising a connecting member for the cathode strips formed in the vicinity of the connecting member for the anode strips, the connecting member for the cathode strips being electrically connected to cathode strips of said another organic EL device; and each of the structures comprising a cathode-lead wire for aging formed so as to pass on the structure with said another organic EL device formed thereon, the cathode-lead wire for aging connecting between the cathode-common wires for aging and the connecting member for the anode strips.

The wires for connection with the cathode strips may comprise cathode circuitous wiring. The wires for connection with the anode strips may comprise anode circuitous wiring. The connecting member for the anode strips may comprise a connection resistance at anode side for aging. The connecting member for the cathode strips may comprise a connection resistance at cathode side for aging. The structure with the another organic EL device formed thereon may comprise another organic EL display device adjacent a first organic EL display device.

According to a second aspect of the present invention, each of the structures comprises said cathode-lead wire for aging formed so as to pass on a side of the organic EL device remote from cathode-circuitous wiring for connecting between the cathode strips and the cathode-mounting terminals in the substrate according to the first aspect.

According to a third aspect of the present invention, the anode-mounting terminals and the cathode-mounting thermals, which are connected to the driving circuit, are formed in the vicinity of the third side of each of the structures; and wherein said cathode-lead wire for aging is formed so as to pass through a position closer to the organic EL device than the cathode-circuitous wiring for connecting between the cathode strips and the cathode-mounting terminals, in the substrate according to the first aspect.

According to a fourth aspect of the present invention, said cathode-lead wire for aging is formed so as to pass under the cathode strips through an insulating film in each of the structures in the substrate according to the third aspect.

According to a fifth aspect of the present invention, there is provided organic EL display devices, each of which comprises anode strips, organic EL layers and cathode strips and is formed in a rectangular shape; each of the organic EL display devices comprising anode-common wires for aging formed so as to pass in the vicinity of a first side thereof; each of the organic EL display devices comprising cathode-common wires for aging formed so as to pass in the vicinity of a second side opposite the first side; each of the organic EL display devices comprising anode-mounting terminals and cathode-mounting terminals formed in the vicinity of a third side thereof so as to be connected to a driving circuit; each of the organic EL display devices comprising a connecting member for the anode strips formed in the vicinity of a fourth side thereof for connection of anode strips of another organic EL device adjacent the fourth side; each of the organic EL display devices comprising a connecting member for the cathode strips formed in the vicinity of the connecting member for the anode strips for connection of cathode strips of said another organic EL device; and each of the organic EL display devices comprising a cathode-lead wire for aging formed so as to connect between the cathode-common wires for aging and the connecting member for the anode strips in the another organic EL display device formed adjacent the third side.

The another organic EL device may be adjacent a first organic EL display device when the third side is formed in said first EL display device. According to a sixth aspect of the present invention, each of the organic EL display devices comprises said cathode-lead wire for aging formed so as to pass on a side of the organic EL device remote from cathode-circuitous wiring for connecting between the cathode strips and the cathode-mounting terminals in the organic EL display devices according to the fifth aspect.

According to a seventh aspect of the present invention, each of the organic EL display devices comprises said cathode-lead wire for aging formed so as to pass through a portion closer to the organic EL device than cathode-circuitous wiring for connecting between the cathode strips and the cathode-mounting terminals in the organic EL display devices according to the fifth aspect.

According to an eighth aspect of the present invention, said cathode-lead wire for aging is formed so as to pass under the cathode strips through an insulating film in the organic EL display devices according to the seventh aspect.

In accordance with the present invention, it is possible to collectively subject organic EL display devices to an aging treatment without decreasing the number of the organic EL display devices cut out of a single glass substrate even when each of the organic EL display devices is configured to have wires drawn out of three sides of the organic EL device having a rectangular shape.

DETAILED DESCRIPTION OF THE PREFERRED EMBODIMENTS

Now, embodiments of the present invention will be described, referring to the accompanying drawings.

First Embodiment

Figure 1:
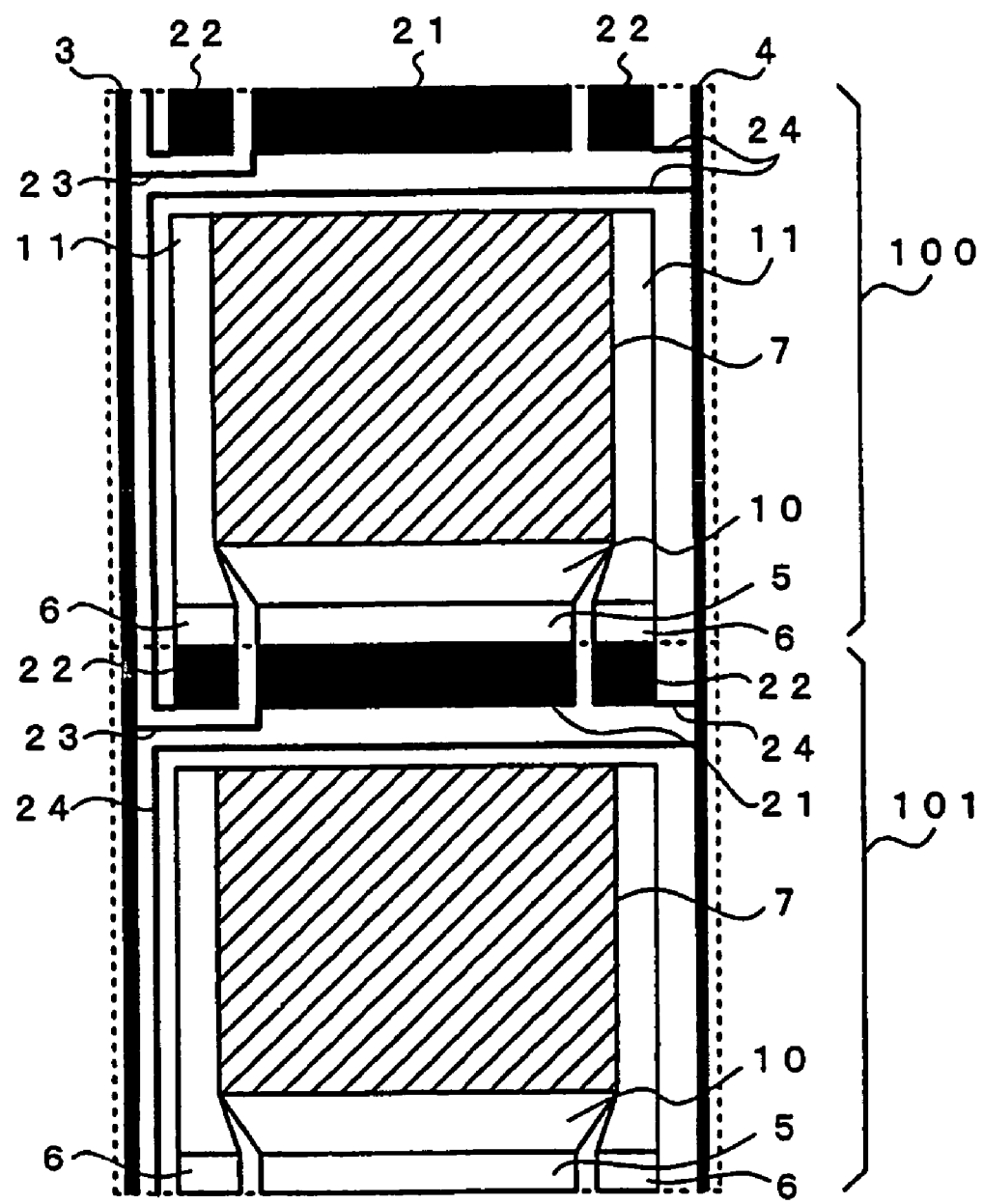
FIG. 1 is a plan view showing the substrate for organic EL display devices, according to a first embodiment of the present invention.

FIG. 1 is a plan view showing organic EL display devices 100 and 101 according to a first embodiment of the present invention. In FIG. 1, an area surrounded by dotted line indicates the organic EL display device 100 or organic EL display device 101 having a rectangular shape. The rectangular shape means that the largest surface of an organic EL display device is rectangular or substantially rectangular, and that the largest surface may be imperfectly rectangular as long as a first side to a fourth side can be specified.

Although the only two organic EL display devices 100 and 101 are shown to be fabricated on a glass substrate (not shown) in FIG. 1, a large number of organic EL display devices are fabricated so as to be close to adjacent organic EL display devices in a matrix pattern on the glass substrate as a matter of fact. The structure of all organic EL display devices is the same as the structure of the organic EL display devices 100 and 101 shown in FIG. 1. Each of the organic EL display devices, which are fabricated on the glass substrate before cutting, corresponds to a structural unit wherein an organic EL device is fabricated so as to include anode wires, organic EL layers and cathode wires. A collection of a large number of structural units corresponds to the substrate for organic EL display devices. However, in the following explanation, a single structural unit will be expressed as the organic EL device 100 or 101 even before cutting.

As shown in FIG. 1, each of the organic EL display devices 100 and 101 has a lower central portion formed with anode-mounting terminals 5 for connection of the relevant organic EL device 7 with driving circuits, such as a driver IC, and each of the organic EL display devices 100 and 101 has lower right and left portions formed with cathode-mounting terminals 6, respectively. For example, the cathode-mounting terminals 6 on the left side are electrically connected to the cathodes in odd-numbered rows, and the cathode-mounting terminals 6 on the right side is electrically connected to the cathodes in even-numbered rows. The anode-mounting terminals 5 and the cathode-mounting terminals 6 are connected to a film-shaped substrate with the driving circuits mounted thereon by COF or TAB after the glass substrate is cut and divided into the respective organic EL display devices. An area with the anode mounting terminals 5 formed therein has terminals formed in a number corresponding to the number of the anodes of the relevant organic EL device 7. Additionally, the cathode-mounting terminals 6 have terminals formed in a number corresponding to the number of the cathodes of the relevant organic EL device 7.

The anodes of an organic EL device 7 are connected to the relevant anode-mounting terminals 5 by anode circuitous wiring 10. Additionally, the cathodes of the organic EL device 7 are connected to the relevant cathode-mounting terminals 6 by cathode circuitous wiring 11 at locations outside right and left sides of the organic EL device 7. An area with the anode circuitous wiring 10 formed therein has wires formed in a number corresponding to the number of the anodes of the organic EL device 7. Additionally, paired areas with the cathode circuitous wiring 11 formed therein have wires formed in a number corresponding to the number of the cathodes of the organic EL device 7.

When fabricating the organic EL display devices 100 and 101, anode-common wires 3 for aging, which energize the anodes of all organic EL display devices fabricated on the glass substrate, and cathode-common wires 4 for aging, which energize the cathodes of all organic EL display devices, are formed on the glass substrate. In the embodiment shown in FIG. 1, anode-common wires for aging 3 is formed in left edge portions of the organic EL display devices 100 and 101 in a single column on the glass substrate in order to energize the anodes of these organic EL display devices 100 and 101. The cathode-common wires for aging 4 is formed in right edge portions of the organic EL display devices 100 and 101 in the single column on the glass substrate in order to energize the cathodes of these organic EL display devices 100 and 101.

Each of the organic EL display devices 100 and 101 has an upper portion (a side of the relevant organic EL display 7 remote from the anode-mounting terminals 5 and the cathode-mounting terminals 6) formed with a connection resistance at anode side for aging 21 as a connection member for anode wires and connection resistances at cathode side for aging 22 as connection members for cathode wires. An area with a connection resistance at anode side for aging 21 formed therein has resistors formed in a number corresponding to the number of the anodes of the relevant organic EL device 7, each of the resistors comprising, e.g., an ITO film or a metal film. Paired areas with a connection resistance at cathode side for aging 22 formed therein have resistors formed in a number corresponding to the number of the cathodes of the relevant organic EL device 7, the resistors comprising, e.g., an ITO film or a metal film.

The connection resistances at anode side for aging 21 and the connection resistances at cathode side for aging 22 are provided for, e.g., the purpose of avoiding the trouble that when an anode and a cathode of an organic EL device is short-circuited during an aging treatment, the voltage applied to the other organic EL devices is lowered.

When each of the organic EL display devices 100 and 101 having a rectangular shape is viewed from a plane on a front side (having a layer containing the cathodes 2), a first side corresponds to the left side (edge) in the plan view shown in FIG. 1, a second side corresponds to a right side (edge) in FIG. 1, a third side corresponds to a lower side (edge) in FIG. 1, and a fourth side corresponds to an upper side (edge) in FIG. 1.

Figure 2A:
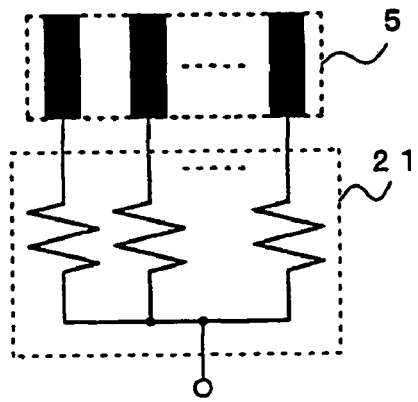
FIGS. 2(A) and 2(B) are schematic circuit diagrams showing the structure of a connection resistance at anode side for aging and the structure of a connection resistance at cathode side for aging, respectively.
Figure 2B:
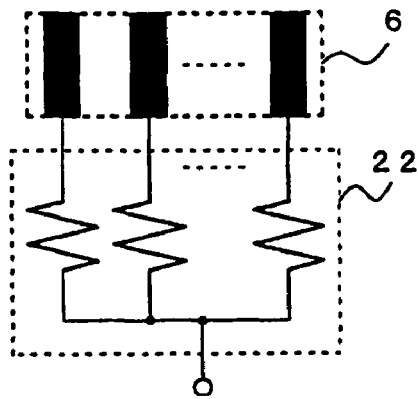

FIG. 2(A) is a schematic circuit diagram showing the structure of each of the connection resistances at anode side for aging 21, and FIG. 2(B) is a schematic diagram showing the structure of each of the connection resistances at cathode side for aging 22. An area of the organic EL display device 101, where the connection resistance at anode side for aging 21 is formed, respective resistors have first ends connected to corresponding terminals in the anode-mounting terminals 5 of the organic EL display device 100 fabricated above the organic EL display device 101. The respective resistors have second ends connected to one another. In each of the paired area of the organic EL display device 101, where a connection resistance at cathode side for aging 22 is formed, respective resistors have first ends connected to corresponding terminal in the cathode-mounting terminals 6 of the organic EL display device 100 fabricated above the organic EL display device 101. The respective resistors have second ends connected to one another. Additionally, in each of the organic EL display devices 100 and 101, the respective resistors of the connection resistance at anode side for aging 21 have the second ends connected to the anode-common wires 3 for aging through an anode-lead wire for aging 23. The respective resistors of the connection resistances at cathode side for aging 22 have the second ends connected to the cathode-common wires 4 for aging through cathode-lead wires for aging 24.

When attention is drawn to the organic EL display device 101, the cathode-lead wire for aging 24, which connects between the connection resistance at cathode side for aging 22 on a side remote from the cathode-common wires for aging 4 and the cathode-common wires for aging 4, is formed as shown in FIG. 1 so that the cathode-lead wire for aging is led out of the connection resistance at cathode side for aging 22, passes outside the cathode circuitous wire 11 (on a side of the organic EL device 7 remote from the cathode-common wires for aging), passes through a space defined by the organic EL device 7, the connection resistances at cathode side for aging 22 and the connection resistance at anode side for aging 21 and is connected to the cathode-common wires for aging 4 in the organic EL display device 100 adjacent to the organic EL display device 101. This arrangement is applied not only to the organic EL display device 101 but also the other organic EL display devices fabricated on the glass substrate. In each of the other organic EL display devices, a cathode-lead wire for aging 24 is led out of a connection resistance at cathode side of aging 22, passes outside the cathode circuitous wire 11 in the organic EL display device fabricated just above, passes through a space defined by the organic EL device 7, the connection resistances at cathode side for aging 22 and the connection resistance at anode side for aging 21 and is connected to the cathode-common wires for aging 4 in the organic EL display device fabricated just above.

On the glass substrate, the anode-common wires for aging 3 in all columns containing the other unshown columns are connected together at, e.g., an upper end of the glass substrate, and the cathode-common wires for aging 4 in all columns containing the other unshown columns are connected together at, i.e., a lower end of the glass substrate. Thus, the respective anodes in all organic EL display devices fabricated on the glass substrate are supplied with a same signal from a supply device for an aging treatment through the anode-common wires for aging 3 before a cutting process. Additionally, the respective cathodes in all organic EL display devices fabricated on the glass substrate can be supplied with the same signal from the supply device for the aging treatment through the cathode-common wires for aging 4. Thus, a large number of organic EL display devices can be collectively subjected to the aging treatment.

The connection between a set of anode-mounting terminals 5 and the relevant connection resistance at anode side for aging 21 is opened in the cutting process. The connection between a set of the cathode-mounting terminals 6 and the relevant connection resistance at cathode side for aging 22 is also opened in the cutting process. The anode-common wires for aging 3 cut in the cutting process, the cathode-common wires for aging 4 cut in the cutting process, the connection resistances at anode side for aging 21 and the connection resistances 22 at cathode side for aging are left in the organic EL display devices 100 and 101. However, these elements have no practical adverse effect since these elements are formed outside the active areas in the organic EL display devise 100 and 101.

Figure 3:
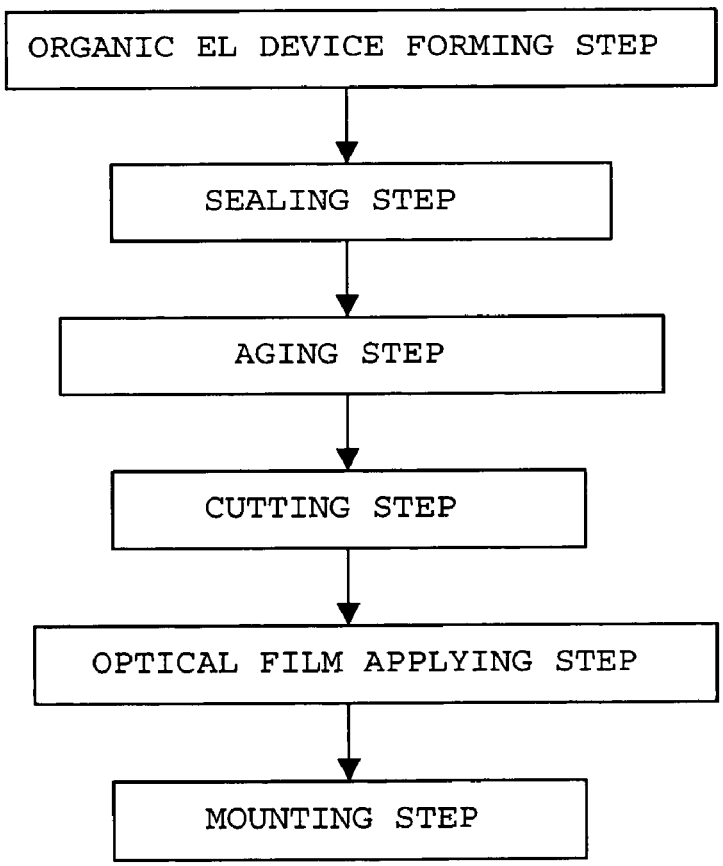
FIG. 3 is a process flowchart explaining an example of the method for fabricating an organic EL display device according to the present invention.

FIG. 3 is a process flowchart explaining an example of the method for fabricating the organic EL display devices 100 and 101 according to the present invention. In the process shown in FIG. 3, the respective organic EL display devices 100 and 101 are fabricated by an organic EL device forming step for forming electrode strips and a plurality of organic EL layers on a single glass substrate, a sealing step for using an opposite substrate made of, e.g., glass to isolate the organic EL layers from ambient air for protection against, e.g., moisture in each of the organic EL display devices, a aging process for subjecting the organic EL display devices 100 and 101 to aging, a cutting step for cutting the glass substrate to separate the organic EL display devices 100 and 101 from one another, an optical film applying step for applying an optical film, such as a circular polarizer to each of the organic EL display devices for prevention of reflection, and a mounting step for mounting a driver IC8 to each of the organic EL display devices.

Figure 4A:
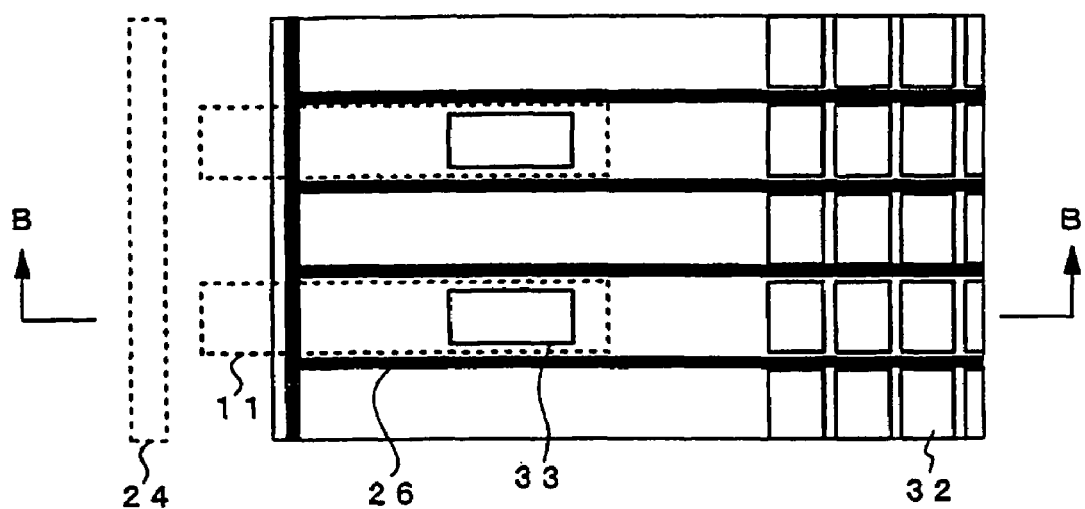
FIGS. 4(A) and 4(B) are a plan view showing cathode circuitous wiring, cathode-lead wires for aging and their peripheral area, and a cross-sectional view showing taken along line B-B of FIG. 4(A), respectively.
Figure 4B:
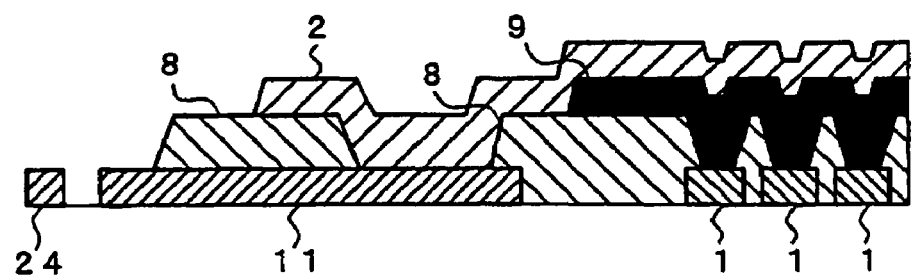

FIG. 4(A) is a plan view showing cathode circuitous wiring 11, a cathode-lead wire for aging 24 and their peripheral areas, and FIG. 4(B) is a cross-sectional view taken along line B-B of FIG. 4(A). In FIG. 4(B), three anodes 1 are also shown.

In the organic EL device forming process shown in FIG. 3, an ITO film is deposited on the glass substrate, and the deposited ITO film is etched to form the anodes 1. Subsequently, a metal film is deposited, and the deposited metal film is etched to form the anode circuitous wiring 10 (not shown in FIG. 4), the cathode circuitous wiring 11, the anode-common wires for aging 3 (not shown in FIG. 4), the cathode-common wires for aging 4 (not shown in FIG. 4), the anode-mounting terminals 5 (not shown in FIG. 4), the cathode-mounting terminals 6 (not shown in FIG. 4) and the cathode-lead wires for aging 24.

The connection resistances at anode side for aging 21 and the connection resistances at cathode side for aging 22 are formed by the ITO film for forming the anodes 1 when forming the anode 1. However, the connection resistances at anode side for aging 21 and the connection resistances at cathode side for aging 22 may be formed by the metal film.

On the layer containing the elements made of the metal film, an insulating film 8 made of a photosensitive polyimide resin is coated. The insulating film 8 is a structure which has apertural areas to delimit the light-emitting areas of the organic EL devices 7. By making exposure, development or the like, an aperture 32 is formed in the insulating film to provide the apertural area functioning as the light emitting portion of each of the pixels in an organic EL device 7. When forming the apertural areas in each of the organic EL devices 7, portions of the insulating film 8, wherein the cathode circuitous wiring 11 is formed, are removed at certain locations to form apertures 33 in the insulating film.

After having coated a negative photosensitive resin (by which the portions that are exposed by light during exposure are left), the photosensitive resin is exposed and developed to form separators 26. By the separators 26 thus formed, the respective cathodes 2, which are formed by vapor deposition in a subsequent process, are separated. By the separators 26, the cathode circuitous wiring 11 is also separated. On the substrate with the anodes 1 and the like formed in this way, organic thin films 9 are laminated as the organic EL layers. As the organic thin films 9, a hole injection layer, a hole transport layer, a light emitting layer, an electron transport layer and an electron injection layer are formed in this order. Finally, the cathodes 2, which are metal, such as aluminum, are formed by vapor deposition. The cathodes 2 are electrically connected to the cathode circuitous wiring 11 at the portions of the insulating film, wherein the apertures 33 are formed. Although the separators are utilized to separate the respective cathodes 2 from one another in this embodiment, the cathodes 2 may be formed so as to be separated from one anther by being deposited in a striped fashion with the use of a mask.

When the organic EL device fabrication step has been completed, the substrate for organic EL display devices as provided so as to have such a structure that each of the anodes 1 in the plural organic EL devices formed on the glass substrate and driven by passive matrix addressing is electrically connected to the relevant anode-common wires for aging 3 through the relevant connection resistance at anode side for aging 21 and the relevant lead wire at anode side for aging 23, and that each of the cathodes 2 in the plural organic EL devices is electrically connected to the relevant cathode-common wires for aging 4 through the relevant connection resistance at cathode side for aging 22 and the relevant cathode-lead wire for aging 24.

Next, in order that the organic EL layers, which have been formed on the glass substrate in the organic EL device forming step, are protected against moisture, another glass substrate as a second substrate is provided so as to confront the glass substrate with the organic EL devices formed thereon, and both glass substrates are bonded together by a peripheral seal as a gap seal. A dry nitrogen gas is sealed in the space encapsulated by the two glass substrate and the peripheral seal.

Then, the short-circuit aging treatment and the lifetime aging treatment are performed in the aging step. In order to energize the anodes 1 and the cathodes 2 for aging, the anode-common wires for aging 3 and the cathode-common wires for aging 4 are connected to the voltage applying device for aging (the supply device). In the short-circuit aging treatment, a voltage is applied at a larger reverse bias than the reverse bias during actual driving. In the lifetime aging treatment, in order to reduce luminance to a desired level in a shorter period of time, the energizing conditions are set so that the luminance of each of the pixels in the aging treatment is higher than the luminance of each of the pixels when the organic EL display devices are driven at rated display operation. For example, when the organic EL display devices have a luminance specification of 200 cd/m$^2$, the organic EL display devices are energized to emit light at 400 cd/m$^2$. By causing the organic EL display devices to emit light at a two-fold higher luminance than the luminance specification required for the organic EL display devices, the aging step is completed in nearly half of the period of time in comparison with a case wherein the organic EL display devices are subjected to aging at the luminance specification required for the organic EL display devices.

In the cutting step, the plural organic EL display devices are separated by cutting both glass substrates. Subsequently, in the optical film applying step, an optical film, such as a circular polarizer, is applied to each of the organic EL display devices for prevention of reflection. Finally, in the mounting step, film-shaped substrates with driving circuits mounted thereto are connected to complete the organic EL display devices 100 and 101.

As explained above, it is possible to collectively energize the plural organic EL display devices in the aging step in accordance with this embodiment. As a result, it is possible to reduce the workload required for performing the aging treatments. Additionally, useless areas can be prevented from being produced in the glass substrate with the organic EL display devices fabricated thereon since there is no need for forming a special area 201 as shown in FIG. 8.

Figure 8:
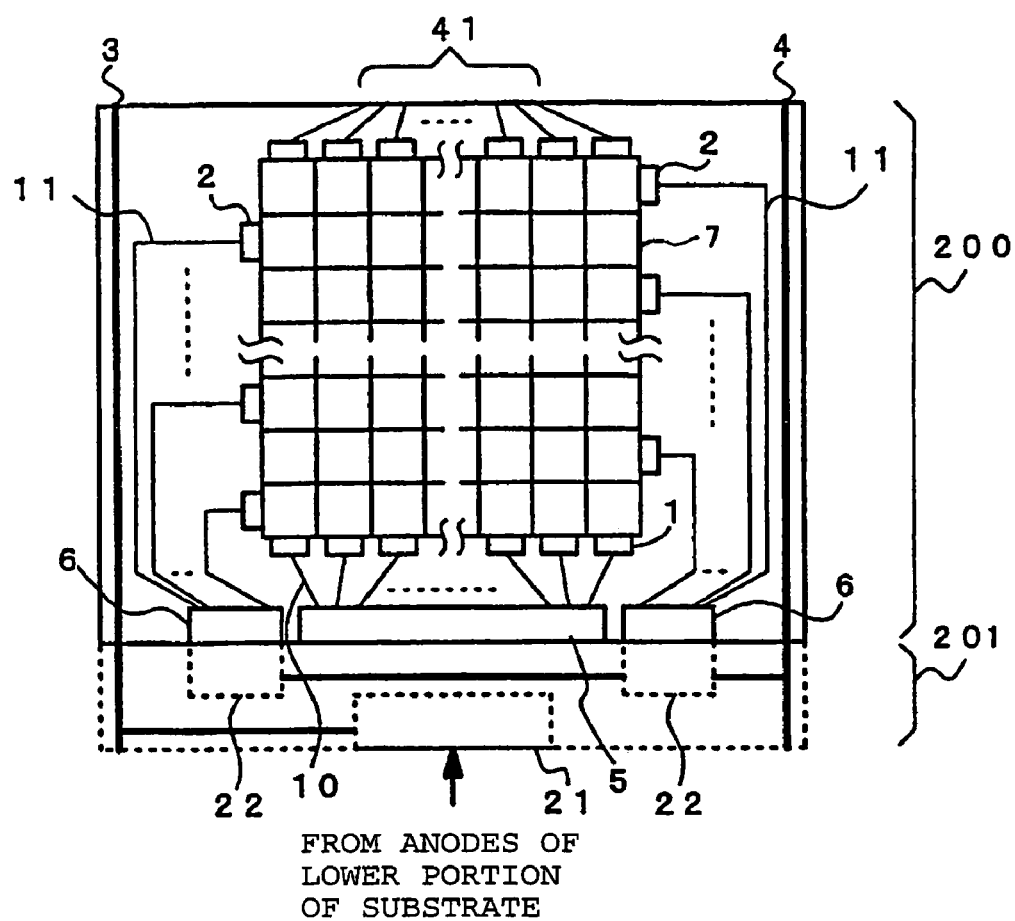
FIG. 8 is a schematic plan view showing an organic EL display device as a comparative example.

Accordingly, it is possible to a larger number of organic EL devices on the substrate for organic EL display devices according to this embodiment in comparison with the substrate for organic EL display devices, which has the structure shown in FIG. 8, i.e., a case wherein the substrate for organic EL display devices is formed so as to include the areas 201. For example, on the assumption that the glass substrate has dimensions of 300 mm×400 mm, and that an organic EL display device has a screen size of 1.1 inch, it is possible to fabricate 132 of organic EL display devices according to this embodiment while it is possible to fabricate 108 of organic EL display devices in the case of the structure shown in FIG. 8.

From the viewpoint of obtaining a low resistance, it is preferred that the metal utilized as the anode-common wires for aging 3 and the cathode-common wires for aging 4 have a surface resistance of 0.2 Ω/square or below and a wire width of 200 μm or above. In consideration of the occupied area on the glass substrate (the occupied area of the glass substrate with the peripheral seal are provided), it is preferred that the metal has a width of 3 mm or below.

It is preferred that the anode-common wires for aging 3 and the cathode-common wires for aging 4 have a resistance of 10 Ω or below. Although it is preferred that a voltage be applied to the respective organic EL devices in an equal manner in the aging treatments, it is possible to input a current of 100 mA or below in the respective organic EL devices when the anode-common wires for aging 3 and the cathode-common wires for aging 4 have a resistance of 10 Ω or below in a case wherein the anode-common wires for aging 3 and the cathode-common wires for aging 4 are connected to 10 of organic EL devices, and wherein a voltage of 10 V is applied in the aging treatments.

Second Embodiment

Figure 5:
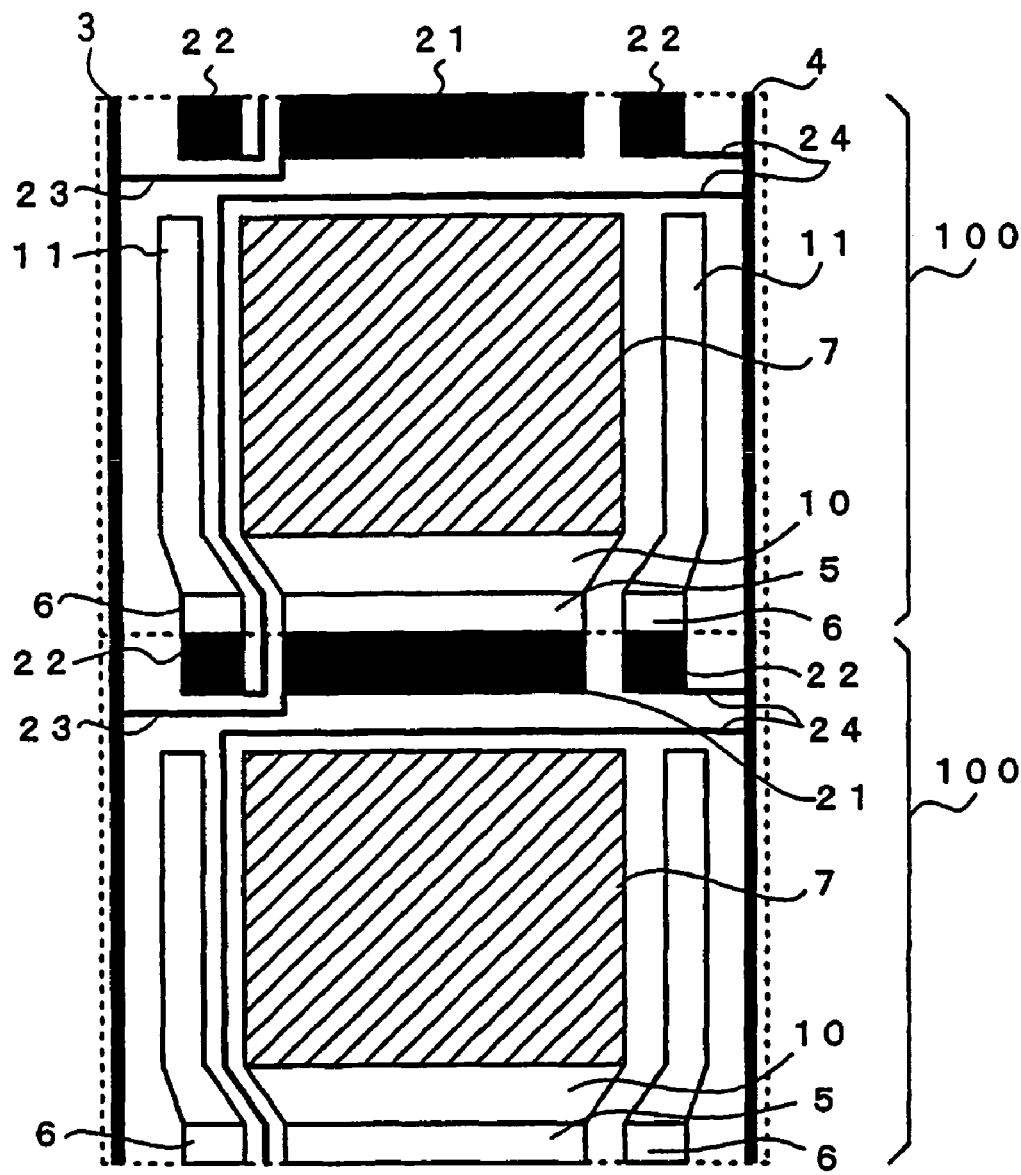
FIG. 5 is a plan view showing the substrate for organic EL display devices, according to a second embodiment of the present invention.

FIG. 5 is a plan view showing the organic EL display devices 100 and 101 according to a second embodiment of the present invention. In the first embodiment, the cathode-lead wire for aging 24, which connects between the connection resistance at cathode side for aging 22 of the organic EL display device 101 on a side remote from the cathode-common wires for aging 4 and the cathode-common wires for aging 4, is formed outside the cathode circuitous wiring 11 (on a side of the organic EL device 7 remote from the cathode-common wires for aging) in the organic EL display device 100. However, the cathode-lead wire for aging may be formed on an inner side of the cathode circuitous wiring 11 (on a side closer to the organic EL device 7) in the organic EL display device 100 as shown in FIG. 5.

Figure 6A:
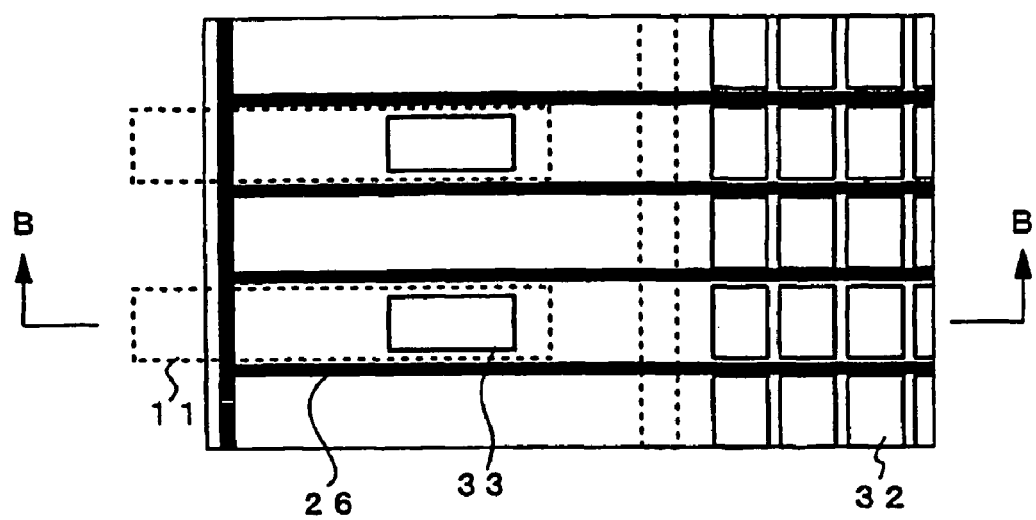
FIGS. 6(A) and 6(B) are a plan view showing cathode circuitous wiring, cathode-lead wires for aging and their peripheral area, and a cross-sectional view showing taken along line B-B of FIG. 6(A), respectively.
Figure 6B:
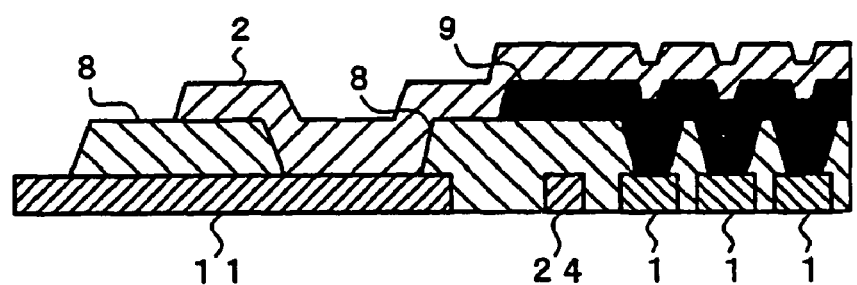
Figure 7:
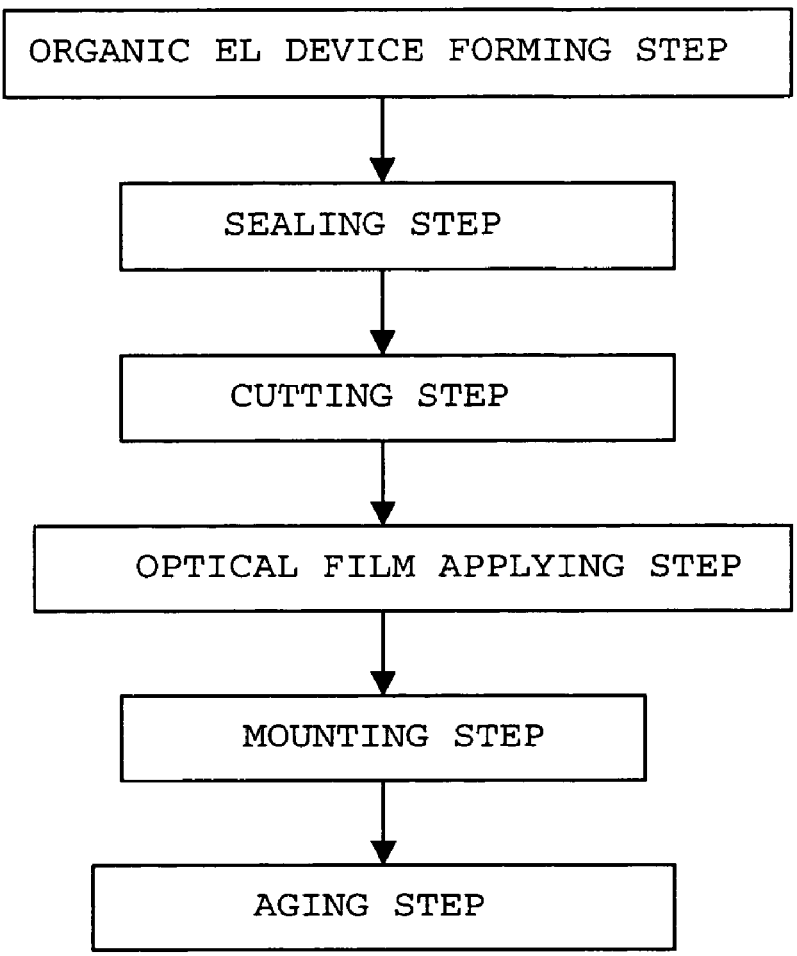
FIG. 7 is a process flowchart explaining an example of the method for fabricating conventional organic EL display devices.

FIG. 6(A) is a plan view showing cathode circuitous wiring 11, the cathode-lead wire for aging 24 and their peripheral areas, and FIG. 6(B) is a cross-sectional view taken along line B-B of FIG. 6(A).

When the organic EL display devices 100 and 101 are fabricated so as to have such a structure as shown in FIG. 5, an ITO film is deposited on the glass substrate, and the ITO film is etched to form the anodes 1 in the organic EL device forming step (see FIG. 3). Subsequently, a metal film is deposited, and the metal film is etched to form anode circuitous wiring (not shown in FIG. 6), the cathode circuitous wiring 11, anode-common wires for aging 3 (not shown in FIG. 6), cathode-common wires for aging 4 (not shown in FIG. 6), anode mounting terminals 5 (not shown in FIG. 6), cathode mounting terminals (not show in FIG. 6) and the cathode-lead wire for aging 24.

On the layer containing these elements, an insulating film 8, which comprises a photosensitive polyimide resin, is coated. Then, apertures 32 and 33 are formed in the insulating film by exposure, development and the like. Additionally, separators 26 are formed.

On the substrate with the anodes 1 formed as stated earlier, organic thin films are laminated as the organic EL layers. Finally, cathodes 2, which comprises metal, such as aluminum, are formed by vapor deposition. The cathodes 2 are electrically connected to the cathode circuitous wiring 11 at positions where the apertures 33 are formed in the insulating film. As shown in FIG. 6(B), the cathode-lead wire for aging 24 are formed to pass under the relevant cathodes 2 through the insulating film 8.

Subsequently, another glass substrate as a second substrate is provided so as to confront the glass substrate with the anodes and the like formed thereon, and both substrates are bonded together by a peripheral seal as a gap seal in the organic EL device forming step. Then, a dry nitrogen gas is sealed in the space encapsulated by the two glass substrates and the peripheral seal.

As in the first embodiment, the short-circuit aging treatment and the lifetime aging treatment are performed in the aging step.

When the aging step has been completed, the plural organic EL display devices are separated from one another by cutting the glass substrates in the cutting step. Next, an optical film, such as a circular polarizer, is applied to each of the organic EL devices for prevention of reflection. In the optical film applying step, film-shaped substrates with the driving circuits mounted thereon are connected to obtain the organic EL display devices 100 and 101 in the mounting step.

In this embodiment as well, it is possible to collectively energize the plural organic EL display devices in the aging step. As a result, it is possible to reduce the workload required for performing the aging treatments. Useless areas can be prevented from being produced on the glass substrate since there is no need for providing special areas 201 as shown in FIG. 8.

In accordance with this embodiment, cathode-lead wire for aging 24, which connects between the relevant connection resistance at cathode side for aging 22 on a side remote from the relevant cathode-common wires for aging 4 and the relevant cathode-common wires for aging 4, are formed of a metal film in a layer under the organic thin films 9. However, the metal cathode-lead wires for aging 24 are electrically isolated from the organic thin films 9 and the cathodes 2 since the insulating film 8 covers the cathode-lead wires for aging 24.

The present invention is applicable to organic EL display devices, each of which is configured so as to have lead wires drawn out of three sides of the organic EL device forming the display area and having a rectangular plane in a case wherein a large number of organic EL display devices are fabricated on a single glass substrate.

The entire disclosure of Japanese Patent Application No. 2004-160227 filed on May 28, 2004 including specification, claims, drawings and summary is incorporated herein by reference in its entirety.

The invention claimed is:

1. A substrate for organic EL display devices, which comprises a plurality of structures, each of the structures having anode strips, organic EL layers and cathode strips and being formed in a rectangular shape, wherein wires for connection with the cathode strips are connected to a first side and a second side of an organic EL device, and wires for connection with the anode strips are connected to a third side of the organic EL device in each of the structures, and wherein anode-mounting terminals and cathode-mounting terminals, which are connected to a driving circuit, are formed in a portion in the vicinity of the third side of each of the structures;

each of the structures comprising anode-common wires for aging formed so as to pass in the vicinity of the first side;

each of the structures comprising cathode-common wires for aging formed so as to pass in the vicinity of the second side;

each of the structures comprising a connecting member for the anode strips formed in the vicinity of a fourth side, the connecting member for the anode strips being electrically connected to anode strips of another organic EL device adjacent the fourth side;

each of the structures comprising a connecting member for the cathode strips formed in the vicinity of the connecting member for the anode strips, the connecting member for the cathode strips being electrically connected to cathode strips of said another organic EL device; and each of the structures comprising a cathode-lead wire for aging formed so as to pass on the structure with said another organic EL device formed thereon, the cathode-lead wire for aging connecting between the cathode-common wires for aging and the connecting member for the anode strips.

2. The substrate according to claim 1, wherein each of the structures comprises said cathode-lead wire for aging formed so as to pass on a side of the organic EL device remote from a cathode-circuitous wiring, the cathode circuitous wiring arranged to electrically connect the cathode strips with the cathode-mounting terminals.

3. The substrate according to claim 1, wherein the anode-mounting terminals and the cathode-mounting terminals, which are connected to the driving circuit, are formed in the vicinity of the third side of each of the structures; and wherein said cathode-lead wire for aging is formed so as to pass through a position closer to the organic EL device than the a cathode-circuitous wiring, the cathode circuitous wiring arranged to electrically connect the cathode strips with the cathode-mounting terminals.

4. The substrate according to claim 3, wherein said cathode-lead wire for aging is formed so as to pass under the cathode strips through an insulating film in each of the structures.

5. Organic EL display devices, each of which comprises anode strips, organic EL layers and cathode strips and is formed in a rectangular shape;

each of the organic EL display devices comprising anode-common wires for aging formed so as to pass in the vicinity of a first side thereof;

each of the organic EL display devices comprising cathode-common wires for aging formed so as to pass in the vicinity of a second side opposite the first side;

each of the organic EL display devices comprising anode-mounting terminals and cathode-mounting terminals formed in the vicinity of a third side thereof so as to be connected to a driving circuit;

each of the organic EL display devices comprising a connecting member for the anode strips formed in the vicinity of a fourth side thereof for connection of anode strips of another organic EL device adjacent the fourth side;

each of the organic EL display devices comprising a connecting member for the cathode strips formed in the vicinity of the connecting member for the anode strips for connection of cathode strips of said another organic EL device; and each of the organic EL display devices comprising a cathode-lead wire for aging formed so as to connect between the cathode-common wires for aging and the connecting member for the anode strips in the another organic EL display device formed adjacent the third side.

6. The organic EL display devices according to claim 5, wherein each of the organic EL display devices comprises said cathode-lead wire for aging formed so as to pass on a side of the organic EL device remote from a cathode-circuitous wiring, the cathode circuitous wiring arranged to electrically connect the cathode strips with the cathode-mounting terminals.

7. The organic EL display devices according to claim 5, wherein each of the organic EL display devices comprises said cathode-lead wire for aging formed so as to pass through a portion closer to the organic EL device than cathode-circuitous wiring, the cathode circuitous wiring arranged to electrically connect the cathode strips with the cathode-mounting terminals.

8. The organic EL display devices according to claim 7, wherein said cathode-lead wire for aging is formed so as to pass under the cathode strips through an insulating film.

* * * * *